United States Patent
Nishijima et al.

(10) Patent No.: US 10,551,468 B2
(45) Date of Patent: Feb. 4, 2020

(54) FAILURE DETECTION APPARATUS FOR VOLTAGE SENSOR

(71) Applicant: Mitsubishi Electric Corporation, Tokyo (JP)

(72) Inventors: Yoshimasa Nishijima, Tokyo (JP); Shingo Yamaguchi, Tokyo (JP); Satoshi Wachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 219 days.

(21) Appl. No.: 14/651,255

(22) PCT Filed: Apr. 9, 2013

(86) PCT No.: PCT/JP2013/060678
§ 371 (c)(1),
(2) Date: Jun. 11, 2015

(87) PCT Pub. No.: WO2014/167644
PCT Pub. Date: Oct. 16, 2014

(65) Prior Publication Data
US 2015/0316636 A1    Nov. 5, 2015

(51) Int. Cl.
*G01R 35/00* (2006.01)
*G01R 31/36* (2019.01)
(Continued)

(52) U.S. Cl.
CPC ....... *G01R 35/00* (2013.01); *G01R 19/16528* (2013.01); *G01R 31/3648* (2013.01); *G01R 31/389* (2019.01)

(58) Field of Classification Search
CPC .............. G01R 19/16528; G01R 35/00; G01R 31/3842
See application file for complete search history.

(56) References Cited

U.S. PATENT DOCUMENTS 8,148,993 B2    4/2012    Yamabe et al.
8,258,742 B2 *    9/2012    Funakoshi ............ H02J 7/1446
                                                                            320/104
(Continued)

FOREIGN PATENT DOCUMENTS

CN    101326446 A *   12/2008    ......... G01R 31/3842
CN    101326446 A     12/2008
(Continued)

OTHER PUBLICATIONS

Communication dated Feb. 4, 2017 from the State Intellectual Property Office of the P.R.C., in counterpart Chinese application No. 201380074986.0.
(Continued)

*Primary Examiner* — Mushfique Siddique
(74) *Attorney, Agent, or Firm* — Sughrue Mion, PLLC; Richard C. Turner

(57) ABSTRACT

A method and apparatus to reliably detect failure in a voltage sensor which detects battery voltage, without erroneous determination, is provided. A current sensor detects charge/discharge current of a battery. The method comprises calculating a charge/discharge current change amount based on the current detected by the current sensor. A voltage sensor detects voltage of the battery. The method also comprises calculating a voltage change amount based on the voltage detected by the voltage sensor. If the charge/discharge current change amount is equal to or greater than a predetermined value and the voltage change amount is smaller than a failure determination value, it is determined that the voltage sensor has failed.

5 Claims, 7 Drawing Sheets

(51) Int. Cl.
*G01R 19/165* (2006.01)
*G01R 31/389* (2019.01)

(56) References Cited

U.S. PATENT DOCUMENTS

| | | | | |
|---|---|---|---|---|
| 2007/0120530 | A1* | 5/2007 | Nozaki | B60L 3/0046 320/130 |
| 2007/0139013 | A1* | 6/2007 | Seo | B60W 10/26 320/130 |
| 2008/0125932 | A1 | 5/2008 | Yamabe et al. | |
| 2009/0128157 | A1* | 5/2009 | Moriya | G01R 31/3624 324/426 |
| 2009/0132188 | A1* | 5/2009 | Watanabe | H01M 10/44 702/64 |
| 2009/0189570 | A1* | 7/2009 | Abe | B60R 16/0232 320/162 |
| 2010/0156356 | A1* | 6/2010 | Asakura | H01M 10/44 320/148 |
| 2011/0037476 | A1* | 2/2011 | Jung | G01R 31/3842 324/433 |
| 2012/0105001 | A1* | 5/2012 | Gallegos | B60L 3/0046 320/109 |
| 2013/0080096 | A1* | 3/2013 | Toki | G06F 15/00 702/63 |
| 2015/0234015 | A1* | 8/2015 | Park | G01R 31/396 702/63 |
| 2016/0091573 | A1* | 3/2016 | Shiraishi | G01R 31/389 324/430 |

FOREIGN PATENT DOCUMENTS

| | | | | |
|---|---|---|---|---|
| CN | 101441251 A | * | 5/2009 | ......... G01R 31/2829 |
| CN | 101441251 A | | 5/2009 | |
| EP | 1 990 645 A1 | | 11/2008 | |
| JP | 10-253682 A | | 9/1998 | |
| JP | 2008-135310 A | | 6/2008 | |
| JP | 2008135310 A | * | 6/2008 | |
| JP | 2008-253129 A | | 10/2008 | |
| JP | 2012-247374 A | | 12/2012 | |
| JP | 2012247374 A | * | 12/2012 | |

OTHER PUBLICATIONS

International Search Report for PCT/JP2013/060678 dated Jul. 23, 2013.
Communication dated Oct. 6, 2015 from the Japanese Patent Office in counterpart application No. 2015-510990.
Communication dated Jul. 17, 2017, from the State Intellectual Property Office of People's Republic of China in counterpart Application No. 201380074986.0.
Communication dated Sep. 30, 2017 issued by the State Intellectual Property Office of People's Republic of China in counterpart Application No. 201380074986.0.
Communication dated Mar. 29, 2018, issued by the State Intellectual Property Office of the P.R.C. in corresponding Chinese Application No. 201380074986.0, total of 13 pages with translation.
Communication dated Nov. 16, 2018, issued by the German Patent and Trademark Office in corresponding German Application No. 11 2013 006 920.2, 7 pages with translation.

* cited by examiner

FAILURE DETECTION APPARATUS FOR VOLTAGE SENSOR

CROSS REFERENCE TO RELATED APPLICATIONS

This application is a National Stage of International Application No. PCT/JP2013/060678 filed Apr. 9, 2013, the contents of all of which are incorporated herein by reference in their entirety.

TECHNICAL FIELD

The present invention relates to a failure detection apparatus for detecting failure in a voltage sensor, particularly, a voltage sensor for detecting battery voltage of a secondary battery.

BACKGROUND ART

A vehicle is provided with a secondary battery that temporarily stores electric energy generated by an electric generator connected to an internal combustion engine via a belt or the like, for supplying required power to electric devices even when the internal combustion engine is not rotating and power cannot be generated by the electric generator, for example.

If such a secondary battery is over-charged or over-discharged, deterioration in the battery is accelerated. Therefore, in the case of using a secondary battery, it is necessary to perform charging or discharging so that the state of charge SOC of the secondary battery will not become an over-charged state or an over-discharged state.

As means for detecting the SOC of the secondary battery, there is known means of calculating the SOC based on secondary battery voltage detected by a voltage sensor.

However, in the above detection means, if the voltage sensor has failed, charging or discharging is performed based on an erroneous SOC, and therefore the SOC of the secondary battery may become an over-charged state or over-discharged state.

Therefore, such an SOC detection apparatus having a voltage sensor is provided with a device for detecting failure in the voltage sensor.

Patent Document 1 discloses a failure detection apparatus that calculates an electromotive force and an internal resistance of a secondary battery based on charge/discharge current of the battery detected by a current sensor and voltage of the battery detected by a voltage sensor, calculates estimated battery voltage of the secondary battery based on the electromotive force and the internal resistance, compares the estimated battery voltage with the battery voltage detected by the voltage sensor, and if a difference therebetween is equal to or greater than a predetermined value, determines that the voltage sensor has failed.

CITATION LIST

Patent Document

Patent Document 1: Japanese Laid-Open Patent Publication No. 2008-135310

SUMMARY OF THE INVENTION

Problems to be Solved by the Invention

Patent Document 1 discloses, as means for calculating the electromotive force of the secondary battery, a method in which a plurality of combination data of charge/discharge current I with battery voltage V are acquired, a V-I approximation straight line which is a primary-approximation straight line of voltage V and current I is calculated through regression analysis, and polarization voltage is subtracted from a V intercept of the V-I approximation straight line, thereby calculating the electromotive force of the battery.

In addition, Patent Document 1 discloses, as means for calculating the internal resistance of the secondary battery, a method in which the internal resistance is calculated from a slope of the V-I approximation straight line calculated by the above method.

However, in the case of using the above methods, if failure has occurred so that the detected value of the voltage sensor becomes a fixed value, the slope of the V-I approximation straight line becomes substantially zero, and the V intercept of the V-I approximation straight line substantially coincides with the detected value of the voltage sensor.

At this time, for example, if the polarization voltage is substantially zero, the electromotive force coincides with the V intercept, i.e., the detected value of the voltage sensor.

On the other hand, the estimated battery voltage is calculated by a product of the internal resistance and the charge/discharge current being subtracted from the electromotive force. In the case where the detected value of the voltage sensor is a fixed value and the polarization voltage is substantially zero as described above, the electromotive force becomes equal to the detected value of the voltage sensor, and the product of the internal resistance and the charge/discharge current becomes substantially zero. Therefore, the estimated battery voltage substantially coincides with the detected value of the voltage sensor.

Therefore, in such a case, a difference between the estimated battery voltage and the detected battery voltage becomes substantially zero, and thus does not exceed the predetermined value. Therefore, it is impossible to detect failure.

Thus, the technique disclosed in Patent Document 1 does not take detection of such failure in the voltage sensor as described above into consideration.

The present invention has been made to solve the above problem, and an object of the present invention is to reliably detect failure in the voltage sensor for detecting the battery voltage, without erroneous determination.

Solution to the Problems

A failure determination apparatus for voltage sensor according to the present invention includes: a current sensor for detecting charge/discharge current of a battery; charge/discharge current change amount calculating means for calculating a charge/discharge current change amount dIs based on the current detected by the current sensor; a voltage sensor for detecting voltage of the battery; voltage change amount calculating means for calculating a voltage change amount dVs based on the voltage detected by the voltage sensor; and failure detection means for, if the charge/discharge current change amount dIs is equal to or greater than a predetermined value and the voltage change amount dVs is smaller than a failure determination value k, determining that the voltage sensor has failed.

Effect of the Invention

According to the present invention, it becomes possible to obtain a failure detection apparatus for voltage sensor capable of reliably detecting failure in a voltage sensor for detecting battery voltage, without erroneous determination.

DESCRIPTION OF EMBODIMENTS

Embodiment 1

Figure 1:
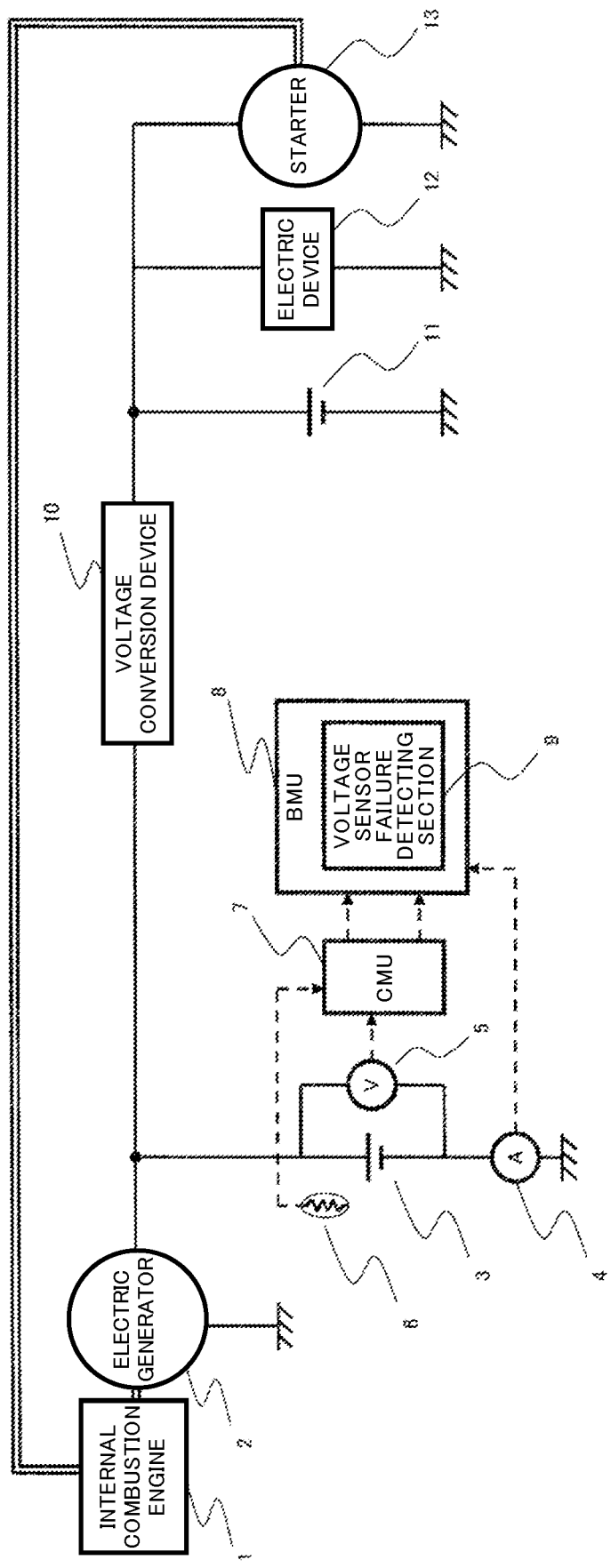
FIG. 1 is a schematic configuration diagram showing an example of a power supply system for an internal combustion engine, provided with a failure determination apparatus according to the present invention.

FIG. 1 shows an example of a schematic configuration diagram of a power supply system for an internal combustion engine, provided with a failure determination apparatus according to the present invention.

An internal combustion engine 1 and an electric generator 2 are connected via a belt or the like, so that when the internal combustion engine 1 rotates, the electric generator 2 also rotates.

When the electric generator 2 rotates, the electric generator 2 performs electric generation. The generated electric energy is used to charge a battery 3, is consumed by an electric device 12 after undergoing voltage conversion by a voltage conversion device 10, or is used to charge a sub battery 11.

Power for driving a starter 13 for starting the internal combustion engine 1 is supplied from the sub battery 11. The batteries are a lithium ion battery, etc.

Here, the voltage conversion device 10 is provided under the assumption that voltages of the battery 3 and the sub battery 11 are different. However, if the voltages are at the same potential, a switch or the like may be used instead.

A lithium ion battery is a secondary battery in which a positive electrode and a negative electrode are insulated by a separator and lithium ions move between the positive electrode and the negative electrode in an electrolysis solution, to perform charging and discharging. If the lithium ion battery is over-charged or over-discharged, there is a possibility of deterioration or internal short-circuit.

A current sensor 4 detects charge current of the battery 3 as a positive value, and discharge current thereof as a negative value, and transmits the detected charge/discharge current to a Battery Management Unit (BMU) 8.

A Cell Monitor Unit (CMU) 7 monitors the battery 3. The CMU 7 transmits information about battery voltage detected by a voltage sensor 5 and a battery temperature detected by a temperature sensor 6, to the BMU 8.

The BMU 8 manages the battery 3. To the BMU 8, the charge/discharge current of the battery 3 is inputted from the current sensor 4, and the battery voltage and the battery temperature are inputted from the CMU 7.

Further, the BMU 8 calculates the state of charge SOC of the battery 3 by current integration or the like based on the inputted charge/discharge current and the inputted battery voltage, and controls charge/discharge current so that the battery 3 will not be over-charged or over-discharged.

A voltage sensor failure detecting section 9 calculates a charge/discharge current change amount dIs based on the charge/discharge current inputted to the BMU 8, and calculates a voltage change amount dVs based on the battery voltage inputted to the BMU 8.

Each change amount is calculated as a differential amount between the present value and the previous value, for example.

Further, the voltage sensor failure detecting section 9 detects failure in the voltage sensor based on the charge/discharge current change amount dIs and the voltage change amount dVs.

Figure 2:
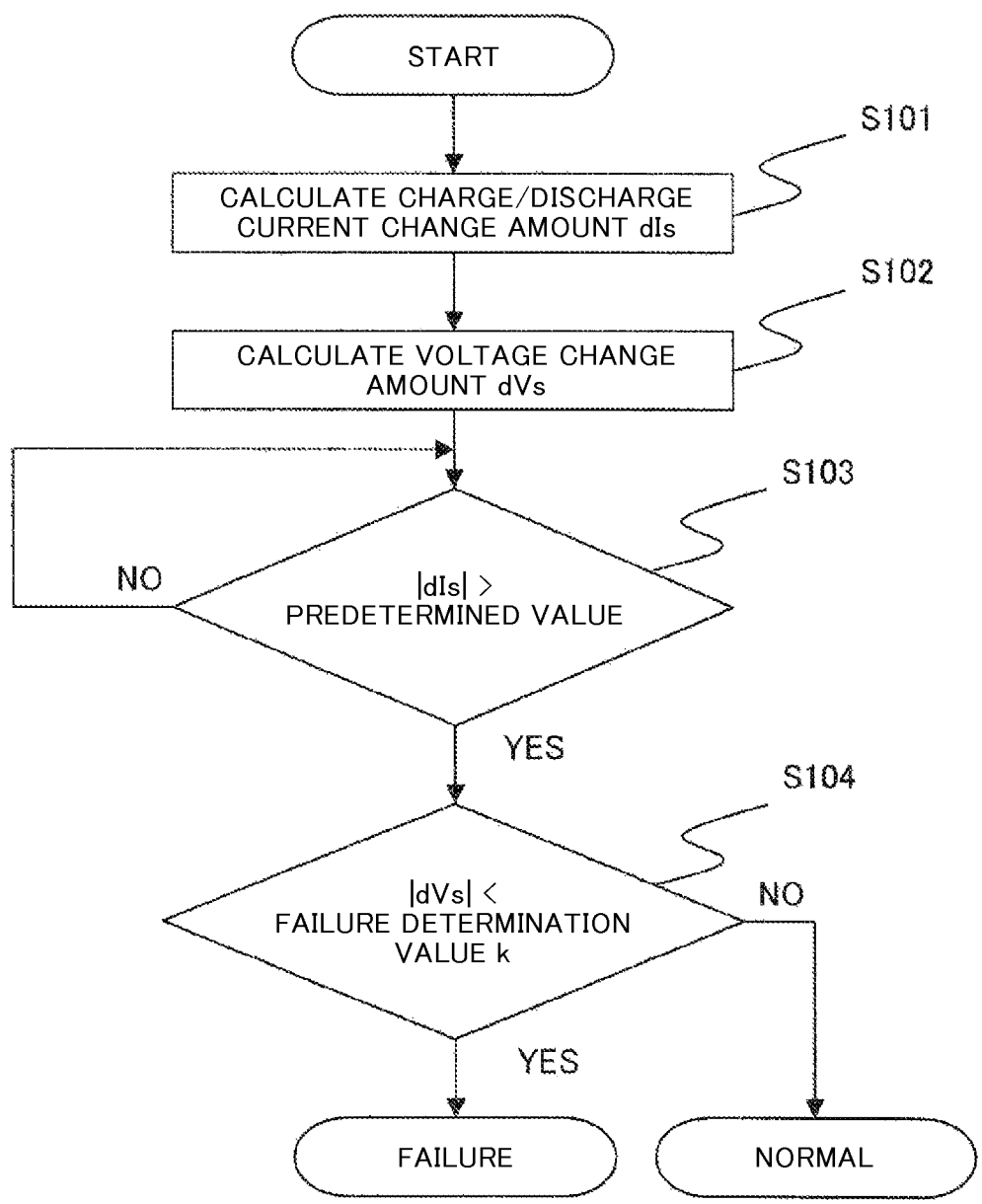
FIG. 2 is a flowchart showing a process by a failure determination apparatus for voltage sensor, according to embodiment 1 of the present invention.

FIG. 2 is a flowchart showing a process by the failure detection apparatus for voltage sensor according to embodiment 1 of the present invention. The process is executed periodically (for example, every 10 ms).

Hereinafter, the failure detection apparatus according to embodiment 1 of the present invention will be described based on the flowchart in FIG. 2.

Battery voltage V in charging or discharging is represented by the following expression (1) using charge/discharge current I of the battery 3, electromotive force E of the battery 3, and an internal resistance r of the battery 3. It is noted that, with regard to the charge/discharge current, charge current is defined as positive and discharge current is defined as negative.

$$V = E + r \cdot I \qquad (1)$$

Therefore, if the battery current changes, the battery voltage should also change. In embodiment 1, failure detection is performed based on the change amount of the battery current and the change amount of the battery voltage.

In step S101, based on the charge/discharge current inputted to the BMU 8, the charge/discharge current change amount dIs is calculated (step S101 corresponds to charge/discharge current change amount calculating means).

In step S102, based on the voltage inputted to the BMU 8, the charge/discharge voltage change amount dVs is calculated (step S102 corresponds to voltage change amount calculating means).

In step S103, the voltage sensor failure detecting section 9 determines whether or not an absolute value |dIs| of the charge/discharge current change amount dIs is greater than a predetermined value.

If |dIs| is greater than the predetermined value, the process proceeds to step S104. If |dIs| is equal to or smaller than the predetermined value, the process is ended.

In step S104, the voltage sensor failure detecting section 9 determines whether or not an absolute value |dVs| of the voltage change amount dVs is smaller than a failure determination value k. If |dVs| is smaller than the failure determination value k, the voltage sensor failure detecting section 9 determines that the voltage sensor 5 has failed (steps S103 and S104 correspond to failure detection means).

As described above, the failure detection apparatus for voltage sensor of embodiment 1 includes: the current sensor 4 for detecting charge/discharge current of the battery 3; the charge/discharge current change amount calculating means S101 for calculating the charge/discharge current change amount dIs based on the current detected by the current sensor 4; the voltage sensor 5 for detecting voltage of the battery 3; the voltage change amount calculating means S102 for calculating the voltage change amount dVs based on the voltage detected by the voltage sensor 5; and the failure detection means S103 and S104 for, if the charge/discharge current change amount dIs is equal to or greater than the predetermined value and the voltage change amount dVs is smaller than the failure determination value k, determining that the voltage sensor 5 has failed. Owing to such a configuration, it is possible to reliably detect failure in the voltage sensor 5 based on the charge/discharge current change amount dIs and the voltage change amount dVs.

Embodiment 2

Figure 3:
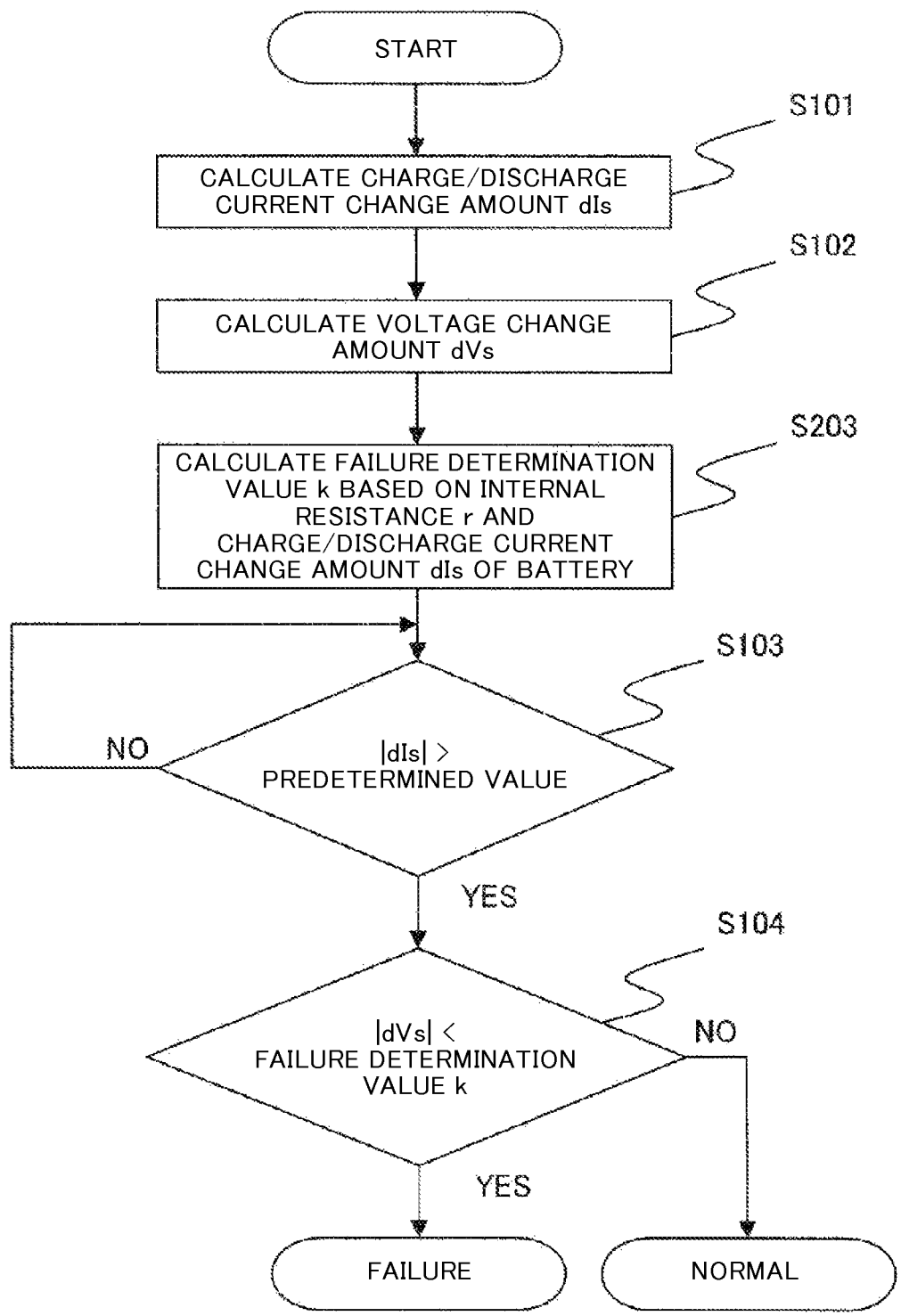
FIG. 3 is a flowchart showing a process by a failure determination apparatus for voltage sensor, according to embodiment 2 of the present invention.

FIG. 3 is a flowchart showing a process by a failure detection apparatus for the voltage sensor 5 according to embodiment 2 of the present invention. The process is executed periodically (for example, every 10 ms).

Embodiment 2 is different from embodiment 1 in the following.

That is, in FIG. 3, step 5203 is added as compared to FIG. 2.

Hereinafter, a difference in FIG. 3 from FIG. 2 will be described.

The battery voltage V in charging or discharging is represented by the following expression (1) as described above.

$$V=E+r \cdot I \quad (1)$$

If the charge/discharge current I changes, the battery voltage V changes by an amount corresponding to a product of the internal resistance r and the charge/discharge current change amount dIs, i.e., r·dIs.

The internal resistance r of the battery 3 varies depending on the type of the battery 3, for example.

Therefore, even if the charge/discharge current change amount dIs is the same, if the internal resistance r is different, r·dIs varies and the voltage change amount dVs varies.

In step S203, considering that the voltage change amount dVs varies depending on the internal resistance r as described above, processing of setting the failure determination value k based on the internal resistance r and the charge/discharge current change amount dIs of battery 3 is performed.

The configuration of embodiment 2 enables the failure determination value to be changed in accordance with the internal resistance of the battery, thereby reliably performing failure detection irrespective of variation in the internal resistance of the battery.

Embodiment 3

Figure 4:
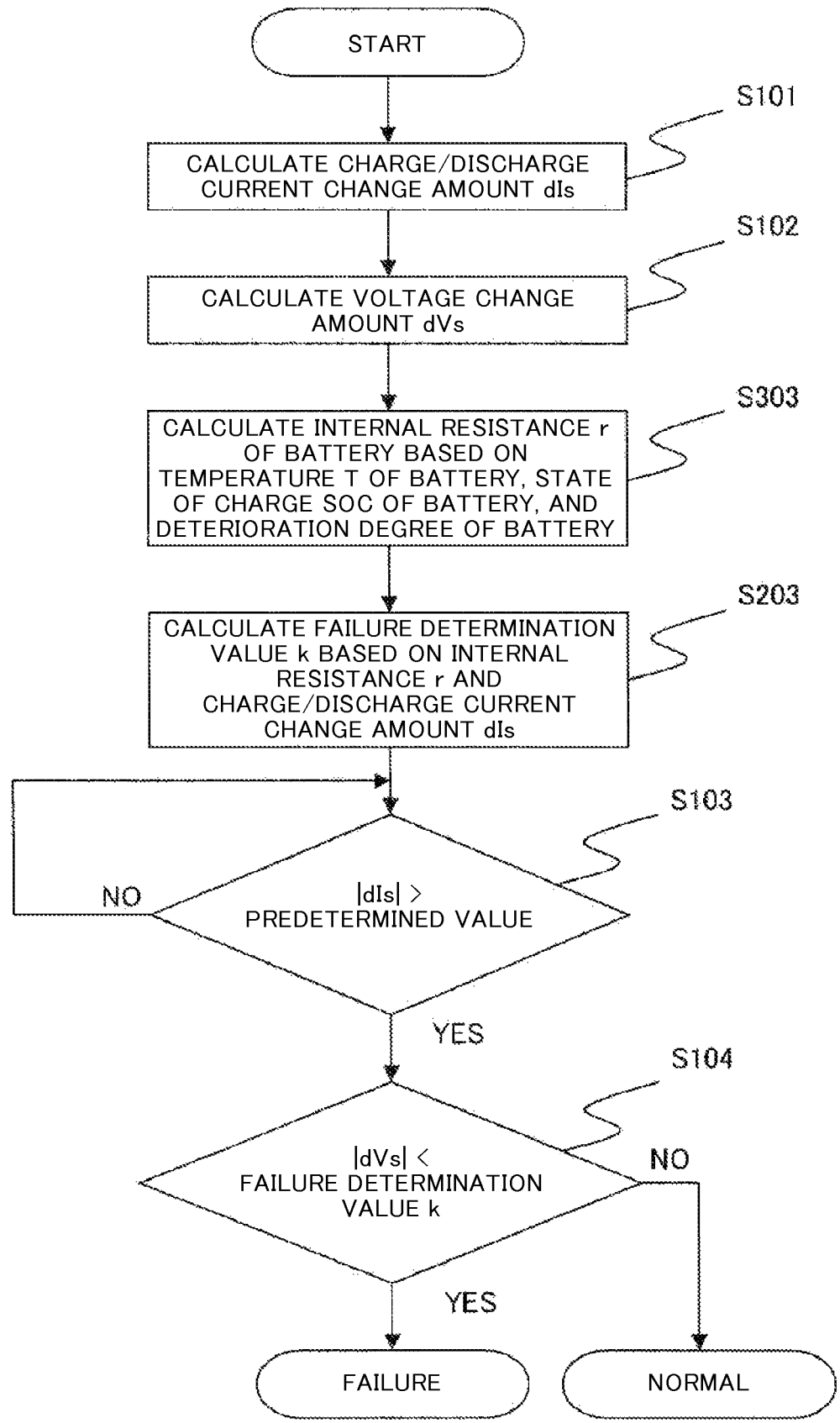
FIG. 4 is a flowchart showing a process by a failure determination apparatus for voltage sensor, according to embodiment 3 of the present invention.

FIG. 4 is a flowchart showing a process by a failure detection apparatus for the voltage sensor 5 according to embodiment 3 of the present invention. The process is executed periodically (for example, every 10 ms).

Embodiment 3 is different from embodiment 2 in the following.

That is, in FIG. 4, step S303 is added as compared to FIG. 3.

Hereinafter, a difference in FIG. 4 from FIG. 3 will be described.

The internal resistance r of the battery 3 indicates a value different depending on a temperature T of the battery 3, the state of charge SOC of the battery 3, or a deterioration degree of the battery 3.

In step S303, considering that the internal resistance varies depending on the temperature, the state of charge, or the deterioration degree of the battery 3, the internal resistance r of the battery 3 is calculated based on a map of the internal resistance r with respect to the battery temperature T detected by the temperature sensor 6, the state of charge SOC of the battery 3, and the deterioration degree of the battery 3, for example.

It is noted that the state of charge SOC and the deterioration degree of the battery 3 are calculated by state-of-charge calculating means and deterioration degree calculating means included in the BMU 8.

The configuration of embodiment 3 enables the internal resistance r to be changed in accordance with the state of the battery 3 and further the failure determination value k to be changed, thereby reliably performing failure detection irrespective of the state of the battery 3.

Embodiment 4

Figure 5:
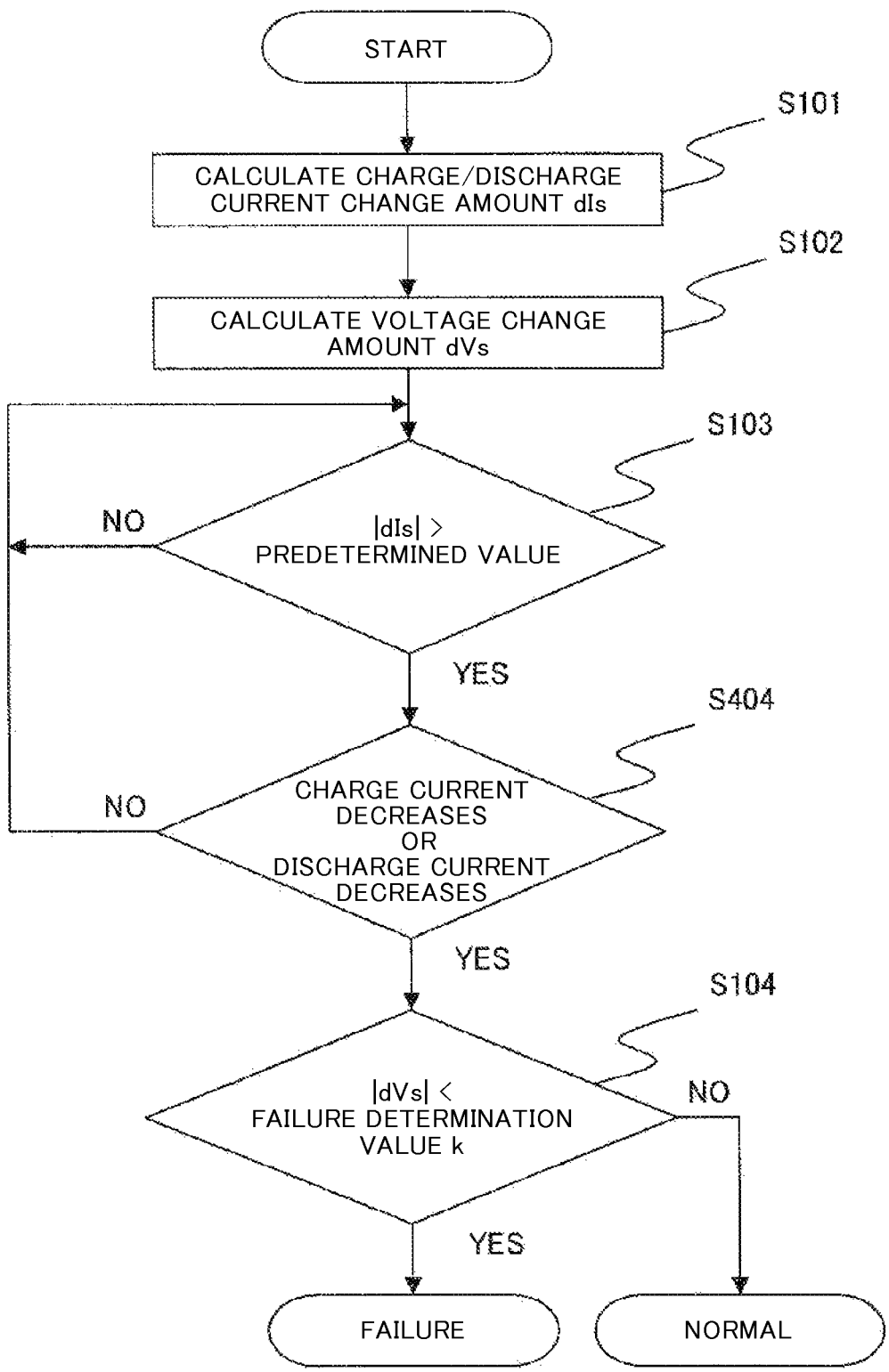
FIG. 5 is a flowchart showing a process by a failure determination apparatus for voltage sensor, according to embodiment 4 of the present invention.

FIG. 5 is a flowchart showing a process by a failure detection apparatus for the voltage sensor according to embodiment 4 of the present invention. The process is executed periodically (for example, every 10 ms).

Embodiment 4 is different from embodiment 1 in the following. That is, in FIG. 5, step S404 is added as compared to FIG. 2.

Hereinafter, a difference in FIG. 5 from FIG. 2 will be described.

The voltage change amount dV of the battery 3 in charging or discharging is represented by the following expression (2) using a charge/discharge current change amount dI of the battery 3 and a change amount dE of the electromotive force of the battery 3.

$$dV=dE+r \cdot dI \quad (2)$$

During charging, the electromotive force constantly increases and therefore the value of dE is constantly positive. The value of r·dI is positive when the charge current change amount dI increases, and is negative when the charge current change amount dI decreases.

Therefore, if the charge current decreases during charging, the value of dE becomes positive and the value of r·dI becomes negative, so that an apparent voltage change amount dV may be substantially zero.

Figure 6:
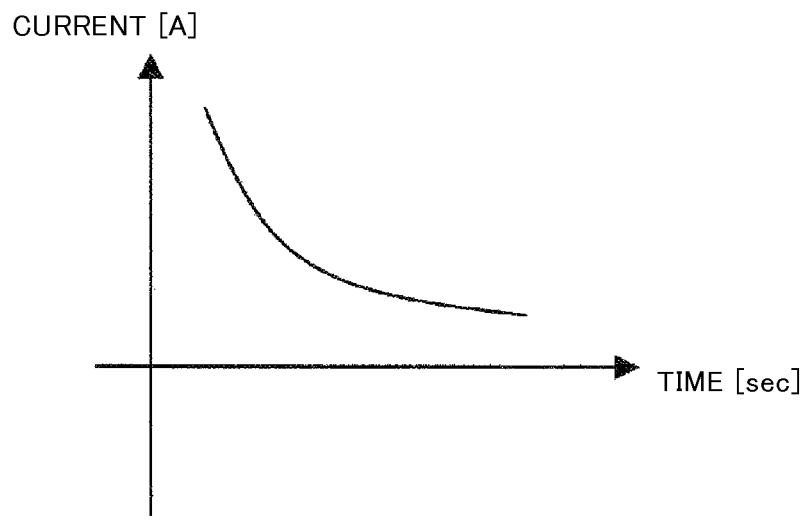
FIG. 6 is a graph showing an example of change in charge current in the case where a voltage change amount in charging is substantially zero.

FIG. 6 is a graph showing change in the charge current in the case where an apparent voltage change amount is substantially zero during charging. Such change can be observed in the case of, for example, constant voltage charging in which charging is performed with constant charge voltage.

During discharging, the electromotive force constantly decreases and therefore the value of dE is constantly negative. The value of r·dI is negative when the charge current change amount dI increases, and is positive when the charge current change amount dI decreases.

Therefore, if the discharge current decreases during discharging, the value of dE becomes negative and the value of r·dI becomes positive, so that an apparent voltage change amount dV may be substantially zero.

Figure 7:
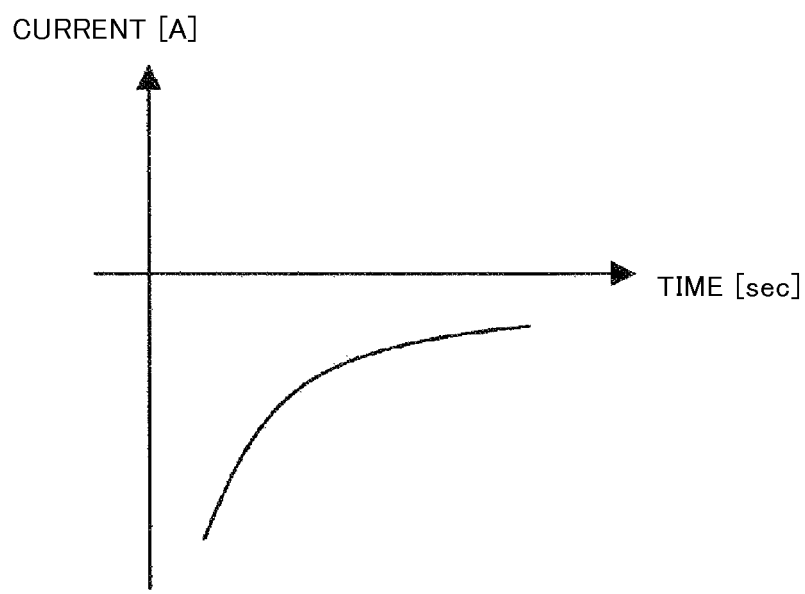
FIG. 7 is a graph showing an example of change in discharge current in the case where a voltage change amount in discharging is substantially zero.

FIG. 7 is a graph showing change in the discharge current in the case where an apparent voltage change amount is substantially zero during discharging.

In step S404, in the case where an apparent voltage change amount is substantially zero as described above, that is, in the case where the charge current decreases or the discharge current decreases, the process is ended without performing failure determination.

In the configuration of embodiment 4, since failure diagnosis is not performed in the case where it is impossible to determine whether or not failure has occurred, erroneous determination can be prevented.

Embodiment 5

Figure 8:
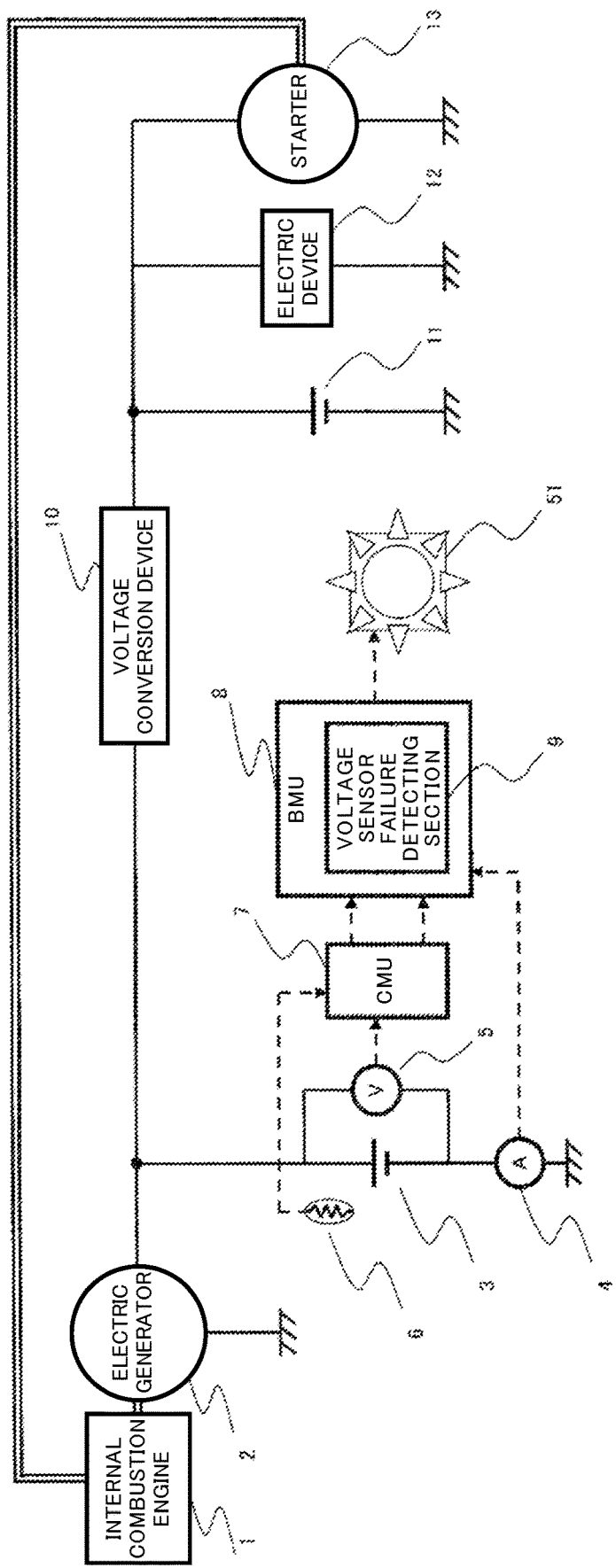
FIG. 8 is a schematic configuration diagram showing an example of a power supply system for an internal combustion engine, provided with a failure determination apparatus for voltage sensor according to embodiment 5 of the present invention.

FIG. 8 shows an example of a schematic configuration diagram of a power supply system for an internal combustion engine, provided with a failure determination apparatus for voltage sensor according to embodiment 5 of the present invention.

A difference from FIG. 1 is that failure detection notification means 51 is added for giving notification to the outside that failure in the voltage sensor has been detected by the voltage sensor failure detecting section 9.

The failure detection notification means 51 notifies a user when failure in the voltage sensor 5 has been detected by the voltage sensor failure detecting section 9.

The configuration of embodiment 5 can prompt a user to stop using the failed voltage sensor or replace the failed voltage sensor, for example.

It is noted that, within the scope of the present invention, the above embodiments may be freely combined with each other, or each of the above embodiments may be modified or abbreviated as appropriate.

DESCRIPTION OF THE REFERENCE CHARACTERS

1 internal combustion engine, 2 electric generator, 3 battery, 4 current sensor, 5 voltage sensor, 6 temperature sensor, 7 CMU, 8 BMU, 9 voltage sensor failure detecting section, 10 voltage conversion device, 11 sub battery, 12 electric device, 13 starter, 51 failure detection notification means

The invention claimed is:

1. A method of detecting a failure of a voltage sensor, the method comprising:
    detecting, with a current sensor, a current of a battery that is one of a charge current or a discharge current, the current sensor being connected to the battery and a battery management unit (BMU);
    detecting, with the voltage sensor, a voltage of the battery, the voltage sensor being connected to the battery and the BMU; and
    performing, via the BMU, following operations:
        calculating a current change amount dIs based on the current detected by the current sensor in a time period between a first time point and a second time point occurring later than the first time point, the current change amount dIs being a differential amount between a first current value and a second current value that are detected at the first time point and the second time point, respectively,
        calculating a voltage change amount dVs based on the voltage detected by the voltage sensor in the time period, the voltage change amount dVs being a differential amount between a first voltage value and a second voltage value that are detected at the first time point and the second time point, respectively,
        comparing the current change amount dIs to a predetermined value,
        comparing the voltage change amount dVs to a failure determination value k, and
        determining that the voltage sensor has failed when the current change amount dIs is equal to or greater than the predetermined value and the voltage change amount dVs is smaller than the failure determination value k, wherein the time period is one of a plurality of time periods, and
    the method further comprises:
        based on the current change amount dIs calculated for each of the plurality of time periods, determining, via the BMU, the failure determination value k as a value determined based on a product of the current change amount dIs and an internal resistance r of the battery for each of the plurality of time periods, and
        variably setting, via the BMU, the failure determination value k for each of the plurality of time periods,
    wherein the internal resistance r is calculated based on the current of the battery detected by the current sensor and the voltage of the battery detected by the voltage sensor.

2. The method of detecting the failure of the voltage sensor according to claim 1, further comprising:
    detecting a temperature T of the battery using a temperature sensor,
    wherein the BMU further performs the following operations:
        calculating a state of charge (SOC) of the battery based on the current of the battery detected by the current sensor and the voltage of the battery detected by the voltage sensor,
        calculating a deterioration degree of the battery, and
        calculating the internal resistance r based on the SOC, the temperature T of the battery, and the deterioration degree.

3. The method of detecting the failure of the voltage sensor according to claim 1, wherein failure diagnosis is not performed in response to a decrease in the charge current or the discharge current.

4. The method of detecting the failure of the voltage sensor according to claim 1, wherein the current change amount dIs corresponding to the differential amount is a value greater than 0.

5. The method of detecting the failure of the voltage sensor according to claim 1, further comprising:
    providing a notification to a user indicating that the failure in the voltage sensor has been detected.

* * * * *